United States Patent [19]

Hatzakis

[11] 4,024,293

[45] May 17, 1977

[54] HIGH SENSITIVITY RESIST SYSTEM FOR LIFT-OFF METALLIZATION

[75] Inventor: Michael Hatzakis, Ossining, N.Y.

[73] Assignee: International Business Machines Corporation, Armonk, N.Y.

[22] Filed: Dec. 10, 1975

[21] Appl. No.: 639,551

[52] U.S. Cl. .................................. 427/43; 427/44; 427/273; 96/35.1; 96/36.2; 96/115 R
[51] Int. Cl.$^2$ ......................................... B05D 3/06
[58] Field of Search ...................... 427/43, 44, 273; 96/35.1, 36.2, 115 R, 27 R

[56] References Cited

UNITED STATES PATENTS

| | | | |
|---|---|---|---|
| 3,799,777 | 3/1974 | O'Keefe et al. ...................... | 427/43 |
| 3,930,857 | 1/1976 | Bendz et al. ......................... | 96/36.2 |
| 3,934,057 | 1/1976 | Moreau et al. ....................... | 427/43 |

OTHER PUBLICATIONS

Chiv et al., "IBM Tech. Disc. Bull., July 1975, vol. 18, No. 2, p. 395.

*Primary Examiner*—John H. Newsome
*Attorney, Agent, or Firm*—Hansel L. McGee

[57] ABSTRACT

High sensitivity resist films for lift-off metallization are formed by coating a substrate with at least two layers of polymeric materials, each layer of which is developed by different developers that are mutual exclusive of one another. The resist can operate for lift-off at electron beam exposure equal to or greater than $5 \times 10^{-6}$ coulombs/cm$^2$.

19 Claims, No Drawings

HIGH SENSITIVITY RESIST SYSTEM FOR LIFT-OFF METALLIZATION

BACKGROUND OF THE INVENTION

This invention relates generally to a double resist layer lift-off technique for high energy radiation lithography and more particularly to highly sensitive resist layers having different solvent development systems.

The formation of positive resist masks from layers of radiation degradable polymers is described, for example, by Haller and Hatzakis in U.S. Pat. No. 3,535,137. In this process a radiation degradable polymer layer is coated on a substrate and is subjected to patternwise exposure to high energy radiation such as, for example, x-rays, nuclear radiation, and electrons. The irradiated regions of the polymer suffer a decrease in molecular weight and thereby become more soluble. A developer is then used to preferentially remove the irradiated portions of the layer. The substrate can then be subjected to an additive or subtractive process such as metallization or etching with the remaining portions of the resist layer protecting the substrate from the processing.

In the formation of integrated circuits or exposure masks, one process which is employed is a lift-off process in which a patterned relief layer of resist is first formed on a substrate. A layer of material, such as a metal for integrated circuit conductor lines or an opaque masking material for mask fabrication is coated over the resist layer and the exposed portions of the substrate. The resist layer is then stripped off and takes with it the overlying material to leave only the pattern of material in direct contact with the substrate. Such a process is described, for example, by M. Hatzakis, Electron Resists for Micro Circuit and Mask Production, Journal of the Electro Chemical Society, Volume 116, No. 7, pages 1033 to 1037, July 1969 and by M. Hatzakis and A. Broers, Record of the Eleventh Symposium on Electron, Ion and Laser Beam Technology, pages 337 to 344.

The described process takes advantage of the natural undercutting of the resist during high energy exposure such that the developed resist pattern is wider at the bottom then the top. This profile aids in forming a discontinuity between the portions of material which are on the substrate surface and the portions which cover the resist. This discontinuity is needed in order to permit the resist stripping solution to attack the unexposed resist and remove it along with the overlying material.

The resist layer thickness required for a metal lift-off process, for example, must be in the ratio of a minimum of about 1.5/1 resist thickness to metal thickness to avoid bridging of metal between the portion on the substrate and the portion covering the resist. Therefore, the loss of unexposed resist during development must be limited. This can be done by increasing exposure times to create a greater molecular weight differential between the exposed and unexposed resist. However, this has the effect of slowing down the exposure process.

Another factor involved in the use of high energy radiation to exposed resist layers is the fact that there are certain advantages to the use of, for example, beams of increasing energy, for example, 10 to 50 kilovolts (KV). This has the advantage of decreasing writing times for a resist because higher amps/per square centimeter can be produced by the electron gun and the higher energy beams also provide more back scatter electron signal for better registration and detection. However, it has been found that for any given resist thickness employed, the higher energy beams produce less electron scattering and undercutting of the resist such that excessive exposure times would be required to obtain the desired undercut profile by exposure alone.

A method of enhancing metallurgical lift-off is disclosed in commonly assigned U.S. Application Ser. No. 426,403 now U.S. Pat. No. 3,934,057 (427/43). The application teaches the use of 2 or more layers of resist, each resist having a different dissolution rates. The layer can be of the same or different polymeric material. The differing dissolution rate can be due to differing molecular weight polymers or of differing tacticity. The layered materials used therein can be dissolved by the same solvent. This method does not provide sufficient improvement in resist sensitivity to allow lift-off below exposures of $2 \times 10^{-5}$ coulombs/cm$^2$. At exposures lower than $2 \times 10^{-5}$ coulombs/cm$^2$ the required development time is so long that the undercut feature of the resist combination can not be maintained. Although the dissolution rate of the two or more resist films in this process is different, the top resist film has a finite development rate which causes the opening on the top film to widen and destroy the undercut if the total development time is long.

One of the limitations of a high speed electron beam fabrication system is resist speed, especially for lift-off metallization where high exposure is required to provide some undercut in the developed resist profile. Until the discovery of the present invention no known assist system was available which could operate for lift-off at $5 \times 10^{-6}$ coul/cm$^2$ or even $10^{-5}$ coulombs/cm$^2$.

SUMMARY OF THE INVENTION

A novel resist film having at least two layers and which provides uniquely excellent characteristics for lift-off metallurgy at relatively low electron exposure densities have been provided.

In accordance with this invention a double resist system having at least two layers, is provided which can operate for lift-off or chemical etching at electron beam exposure of $5 \times 10^{-5}$ coul/cm$^2$ and is compatible with all fabrication processes and features a very short development time.

DETAILED DESCRIPTION

The resists useful in the practice of the invention are those which are degraded by exposure of electron beam radiation as low as $5 \times 10^{-6}$ coulombs per centimeter square with at least 0.5 micron resolution and no thickness loss of the main resist layer. The resist used is comprised of a co-polymer of polymethyl methacrylate (PMMA) and methacrylic acid (MAA) which is a high contrast electron resist. In a preferred application, this resist is used as the bottom layer because its adhesion and etching characteristics are superior to pure PMMA which is used as the second or upper layer of the resist system. However, it should be understood that the layers can be used in reverse order.

The co-polymer can be composed of from 40% to 95% PMMA and from 5% to 60% MAA. The preferred composition is 76% PMMA and 24% MAA. The co-polymer can have a molecular weight of from about 20K to about 1M. At exposures of $5 \times 10^{-5} - 3 \times 10^{-5}$ coul/cm$^2$ at 1–30 KV, the co-polymer resist is not developable in non-polar solvents such as methyl-isobutyl-ketone or chlorobenzene. It can be developed in a suitable solution such as ethyl Cellosolve acetate and ethyl alcohol.

The PMMA used has a molecular weight of from about 20K to about 1M. It can be developed in suitable solvents such as dry methyl-isobutyl-ketone or chlorobenzene. It can not be developed in polar solvents such as ethyl alcohol or isopropyl alcohol at exposures between $5 \times 10^{-6} - 10^{-4}$ at 10–30 KV.

It should be understood that a feature of the invention is that each layer of the resist is developed by different solvents. The developers used are mutually exclusive, that is the developer of one layer does not attack the other layer even in the exposed areas. This prevents overdevelopment of one layer while the other is being developed and allows for much higher resolution than any prior art resist system proposed thus far.

The layer thicknesses of resist which are employed are generally in the range conventionally employed for resist etching and lift-off processing. The resist layers should be thick enough so that the final thickness of resist will avoid excessive pinholes or be sufficient to give the required thickness for a lift-off process. Generally the underlayer thickness will range from about 2000A to 20,000A. The top layer thickness should be thick enough, based on its solubility rate in the developer so that some thickness of the upper layer will be retained at lest until the underlayers are developed through to the substrate. Generally top layer thicknesses will range from about 4,000A to 10,000A.

The application of the resist layers can be by conventional means such as by spin or dip coating from solvent solutions. The underlayer is preferably prebaked at a temperature above the glass transition temperature but below the decomposition point to avoid dissolution of the film when the top layers are spin coated. The top layer is also prebaked prior to exposure.

The exposure is by high energy radiation such as x-ray, nuclear radiation, electron beam and so forth. A preferred method of exposure is by employing an electron beam of from about 10 to 30 KV at exposure times which provide dosage of from about 5 to 30 microcoulombs per square centimeter depending upon the sensitivity of the particular resist structure employed.

The following examples are by way of illustration and not by limitation.

EXAMPLE I

A 6,000A thick layer of a 76/24 co-polymer of 76/24 PMMA-MAA (Mw = 642K: Mn = 289K) was spun cast from an 7% solution by weight of the co-polymer in ethyl-Cellosolve-acetate on to a silicon wafer. The resist film was prebaked at a temperature of about 200° C in air for about one hour. A second layer of PMMA (Mw = 459K Mn = 114K was spun cast atop the first resist film from a 10% solution by weight of the polymer in chlorobenzene. The PMMA film is then prebaked at a temperature of about 160° C in air for about 20 minutes. The double layered films were exposed at a charge density of $5 \times 10^{-6}$ coulombs per square centimeter using a 0.1 micron diameter electron beam at an energy of 25 KV. The resist was then developed in dry methyl-isobutyl-ketone until a desired pattern was completely developed in the top resist, i.e., for about 4 to 40 minutes depending upon the molecular weight of the PMMA. The sample was then rinsed in ethyl alcohol and developed in a second solution consisting of 1 part ethyl Cellosolve acetate to 5 parts ethyl alcohol for approximately 4 minutes. This was followed with rinsing in ethyl alcohol and drying. The developed pattern had a resolution of at least 0.5 microns. The resist withstood chemical etching with both basic and acidic etch solutions, including polysilicon etchants, metal lift-off was also readily obtainable.

In the following Example 2, two co-polymers of differing composition are used. This is illustrative of the scope of the invention in that polymeric materials other than those described herein can be used provided that they are developable by different and mutually exclusive developers.

EXAMPLE 2

A co-polymer of 76/24 PMMA-MAA 10,000A thick was spin coated from 7% solution in ethyl Cellosolve acetate on silicon wafers and baked at 200C for 30 minutes.

A second layer of 95/5 PMMA-MAA (Mw = 1.5M Mn = 500K) co-polymer 8,000A thick was spin coated from 5% solution in ethyl-Cellosolve-acetate on top of the first co-polymer layer and baked at 200C for 30 minutes. The samples were exposed at $2 \times 10^{-6}$ coul/cm$^2$ KV and developed as follows:

The top layer was developed in methyl-isobutylketone for 30 minutes or until a clear image was developed in the top layer.

The bottom layer was developed in a mixture containing 9 parts ethyl-Cellosolve and 1 part wafer for 8 minutes or until a clear image was developed in the bottom layer. After rinsing with isopropanol and drying the resist system was used for successful lift-off metallization. The remaining thickness on the top layer after development was 3000A.

As illustrated in the invention a resist system is provided which can be degraded by electron beam energizes as low as $2 \times 10^{-6}$ coul/cm$^2$, with at least 0.5 micron resolution and with no thickness loss of the main resist layer. The system can be efficiently used for lift-off metallization.

While the invention has been particularly shown and described with reference to preferred embodiments thereof, it will be understood by those skilled in the art that the foregoing and other changes, form and details may be made therein without departing from the spirit and scope of the invention. For instance, the order to the two resist layers could be reversed, that is the PMMA applied first and the co-polymer second, for certain applications requiring higher temperature stability on the top layer. Again this reversal should not influence the performance of the two resist layer system since the two developers are mutually exclusive.

It is also understood that more than two layers of resist can be utilized if its desirable to further extend the sensitivity of the system.

What is claimed is:

1. A high sensitivity electron resist system for lift-off metallization comprising at least two resist layers coated on a substrate, each of said layers being a radiation degradable organic polymer with each layer being developable by different solvents, which solvents being separably capable of dissolving of one said resist layers but not the other.

2. A high sensitivity electron resist system for lift-off metallization according to claim 1, wherein the polymer of one of said resist layers is a co-polymer with a monomer of the polymer of the other of said resist layers.

3. A high sensitivity electron resist system for lift-off metallization according to claim 2, wherein one of said resist layers is a co-polymer of PMMA and MAA and another of said resist layers is PMMA.

4. A high sensitivity electron resist system for lift-off metallization according to claim 3, wherein said co-polymer of PMMA and MAA is comprised of from about 5% to about 60% of MAA, the remainder being PMMA.

5. A high sensitivity electron resist system for lift-off metallization according to claim 4, wherein said co-polymer has a Mw of about 20K to about 1M and said PMMA has a Mw of about 20K to about 1M.

6. A high sensitivity electron resist system for lift-off metallization according to claim 5, wherein said co-polymer has a Mw of 642K and said PMMA has a MW of 459K.

7. A high sensitivity electron resist system for lift-off metallization according to claim 4, wherein said co-polymer is comprised of 76% PMMA and 24% MAA.

8. A high sensitivity electron resist system for lift-off metallization according to claim 2, wherein said system is radiation degradable by exposure to electron beam radiation having a charge density of about $5 \times 10^{-6}$ coul/cm$^2$.

9. A high sensitivity electron resist system for lift-off metallization according to claim 2, wherein said resist layers are composed of co-polymers of PMMA and MAA.

10. A high sensitivity electron resist system for lift-off metallization according to claim 9, wherein one of said resist layers is composed of co-polymer of 76% PMMA and 24% MAA and another of said resist layers is composed of 95% PMMA and 5% MAA.

11. A process for forming a resist mask comprising:
a. successively coating at least 2 resist layers of radiation degradable polymeric materials on a substrate;
b. exposing said resist layers to high energy radiation;
c. developing the uppermost resist layer in a solvent until a desired pattern is totally developed;
d. rinsing said development uppermost resist layer in a solvent;
e. developing the lowermost resist layer in a solvent, which is non-solvent for said uppermost resist layer, until the desired pattern is completely developed, and thereafter;
f. rinsing and drying said developed mask.

12. A method according to claim 11, wherein said resist layers are radiation degradable by electron beam radiation having a charge density of $5 \times 10^{-6}$ coul/cm$^2$.

13. A method according to claim 11, wherein one of said resist layers is a co-polymer composed of PMMA and MAA and another of said resist layers is composed of PMMA.

14. A method according to claim 13, wherein said co-polymer is composed of from about 40% to about 95% PMMA and from about 5% to about 60% MAA.

15. A method according to claim 13, wherein said co-polymer has a Mw from about 20K to about 1M.

16. A method according to claim 13, wherein said co-polymer has a Mw of 624K and said PMMA has a Mw of 459K.

17. A method according to claim 14, wherein said co-polymer is composed of 76% PMMA and 24% MAA.

18. A method according to claim 11, wherein said resist are co-polymers composed of PMMA and MAA.

19. A method according to claim 11, wherein one of said resist layers is a co-polymer composed of 76% PMMA and 24% and another of said resist layers is a co-polymer composed of 95% PMMA and 5% MAA.

* * * * *